United States Patent [19]

Van Der Star

[11] Patent Number: 5,008,618
[45] Date of Patent: Apr. 16, 1991

[54] SCAN TEST APPARATUS FOR ASYNCHRONOUS CIRCUITRY

[75] Inventor: Max Van Der Star, Hilversum, Netherlands

[73] Assignee: U.S. Philips Corporation, New York, N.Y.

[21] Appl. No.: 468,534

[22] Filed: Jan. 23, 1990

[30] Foreign Application Priority Data

Jan. 23, 1989 [NL] Netherlands ........................ 8900151

[51] Int. Cl.⁵ ...................... G01R 31/00; G01R 31/02
[52] U.S. Cl. .............. 324/158 R; 371/22.3; 371/22.6; 371/25.1
[58] Field of Search .................... 371/22.1, 22.3, 22.4, 371/22.5, 22.6, 25.1, 62; 377/54, 67; 324/158 R, 73.1

[56] References Cited

U.S. PATENT DOCUMENTS

| | | | |
|---|---|---|---|
| 3,761,695 | 9/1973 | Eickelberger et al. | 371/22.3 |
| 4,423,509 | 12/1983 | Feissel | 371/22.3 |
| 4,542,509 | 9/1985 | Buchanan et al. | 371/22.3 |
| 4,580,137 | 4/1986 | Fiedler et al. | 371/22.3 |
| 4,622,669 | 11/1986 | Pri-Tal | 371/25.1 |
| 4,856,002 | 8/1989 | Sakashita et al. | 371/22.3 |
| 4,864,579 | 9/1989 | Kishida et al. | 371/25.1 |
| 4,870,345 | 9/1989 | Tomioka et al. | 371/25.1 |
| 4,879,718 | 11/1989 | Sanner | 377/67 |
| 4,897,837 | 1/1990 | Isihara et al. | 371/22.3 |

OTHER PUBLICATIONS

"Hardware Reset of LSSD Logic Chip During System Operation", by IBM, IBM Tech. Disc. Bull., vol. 28, #4, 9/85, pp. 1485-1486.

"Generalized Scan Test Technique for VLSI Circuits", by IBM, IBM Tech. Disc. Bull., vol. 28, #4, 9/85, pp. 1600-1604.

Primary Examiner—Kenneth Wieder
Assistant Examiner—William J. Burns
Attorney, Agent, or Firm—Jack D. Slobod

[57] ABSTRACT

A scan test cycle is implemented for circuits having sets of elements controlled by mutually asynchronous clock signals by forming a separate scan chain for stimulus and response patterns for the element sets controlled by each clock signal and by performing a separate test sub-cycle for each scan chain.

12 Claims, 1 Drawing Sheet

SCAN TEST APPARATUS FOR ASYNCHRONOUS CIRCUITRY

BACKGROUND OF THE INVENTION

The invention relates to a method of testing, using the scan test principle, a circuit which comprises a set of bistable elements and a set of combinatory logic elements connected thereto, for testing a scan chain being formed by a cascade connection of bistable elements which are controlled by the same clock signal, a test cycle comprising the following steps:

an input step during which a stimulus pattern is written into the bistable elements;

a processing step during which a response pattern, formed from the stimulus pattern under the influence of combinatory logic elements, is transferred to the scan chain under the control of the relevant clock signal;

an output step during which the response pattern is serially read from the scan chain.

The invention also relates to a circuit suitable for the use of such a method.

In a circuit comprising a set F of bistable elements, referred to hereinafter as flip-flops, and a set L of combinatory logic elements, where inputs of F (or L) are direct inputs of the circuit or outputs of L (or F) and outputs of F (or L) are direct outputs of the circuit or inputs of L (or F), according to the scan test principle a stimulus pattern is applied, in a test state of the circuit, to the flip-flops which, linked via a test data path so as to form a shift register, constitute one scan chain, and to any direct inputs of the circuit. To this end, the data inputs of the flip-flops may be preceded by multiplexers. The circuit having been set to an execution state, this stimulus pattern is converted in parallel into a response pattern under the influence of the combinatory logic elements, the part of the response pattern which appears on the inputs of the flip-flops being transferred in parallel to the scan chain under the influence of an active portion of the clock signal after which, the circuit having been set to the test state again, said part is serially read, possibly at the same time a next stimulus pattern being serially written into the scan chain. The part of the response pattern which appears on the direct outputs of the circuit can be checked prior to the active portion of the clock signal. The stimulus bits present in the stimulus pattern written into the flip-flops and on the inputs of L unambiguously determine the response bits in the response pattern. Stimulus patterns can be generated, for example by means of an automatic test pattern generator.

The scan test principle is known from U.S. Pat. No. 3,761,695 and is utilized in fully synchronous circuits (circuits which are driven by a single clock signal only). The simultaneous testing of all elements to be scanned is possible only when one clock signal drives the entire circuit.

When use is made of several, non-synchronous clock signals, the following problem is encountered: as soon as a first set of flip-flops which is controlled by a first clock signal stores a response pattern under the influence of an active portion of said first clock signal, these flip-flops no longer supply the correct stimulus bits to the remainder of the circuit; in a second set of flip-flops, controlled by a second clock signal, an incorrect response pattern would then be stored under the influence of a later active portion of said second clock signal.

This problem could be solved by utilizing delay mechanisms for mutually synchronizing the various clock signals. These delay mechanisms, however, often are very difficult to implement in practice and strongly increase the complexity of simulations.

SUMMARY OF THE INVENTION

It is inter alia an object of the invention to provide, based on a scan test without delay mechanisms, a test method for testing non-fully synchronous or individually synchronous circuits. These are circuits in which the set of flip-flops can be subdivided into a number of (at least two) sub-sets, each of which is controlled by one respective clock signal, the various clock signals being asynchronous with respect to one another. The clock signals are externally accessible and can be separately activated.

In accordance with a first aspect of the invention, this object is achieved by means of a method of testing a circuit which comprises a set of bistable elements and a set of combinatory logic elements which is connected thereto, according to which method a first and a second scan chain are formed, each chain consisting of a respective cascade connection of bistable elements which are controlled by a first and a second clock signal, respectively, which clock signals are mutually asynchronous, a test cycle comprising: (1) an input step during which a stimulus pattern is written into the bistable elements, a first stimulus sub-pattern being written into the first scan chain whilst a second stimulus sub-pattern is written into the second scan chain; a first test sub-cycle comprising: (2a) a processing step for the first scan chain during which a first response sub-pattern of a response pattern formed from the stimulus pattern under the influence of the combinatory logic elements is transferred to the first scan chain under the control of the first clock signal and in the absence of any other asynchronous clock signal; (2b) an output step for the first scan chain during which the first response sub-pattern is serially read; (2c) a refresh step for the first scan chain during which the first stimulus sub-pattern is refreshed; and a second test sub-cycle comprising: (3a) a processing step for the second scan chain: as the step (2a), be it that "first" is to be replaced by "second"; (3b) an output step for the second scan chain: as the step (2b), be it that "first" is to be replaced by "second". Because there is only one clock signal with only one active portion in each test sub-cycle, the other scan chain will not be influenced when the response sub-pattern is transferred to the relevant scan chain associated with the relevant clock signal. When the first response sub-pattern is read, the first stimulus sub-pattern is serially written again into the relevant first scan sub-chain, formed by the linking of shift registers in the form of a shift register, after which the second test sub-cycle commences.

In accordance with a further aspect of the invention, the method is characterized in that the set of bistable elements is subdivided into as many scan chains as there are mutually asynchronous clock signals, a test cycle comprising an input step (1) for all scan chains and for each scan chain, with the exception of a last scan chain, a respective test sub-cycle which successively comprises a processing step which is analogous to (2), an output step which is analogous to (2b), and a refresh step which is analogous to (2c), a last test sub-cycle for a last scan chain successively comprising a processing step which is analogous to (3a) and an output step which is analogous to (3b). All flip-flops can thus be tested.

One version of a method in accordance with the invention is characterized in that a scan chain is subdivided into a plurality of scan sub-chains, the scan sub-chains being simultaneously subjected to the same test sub-cycle during a test cycle. The input and output of patterns can thus be accelerated.

When the circuit contains dynamic logic, the data in the circuit do not remain unmodified long enough for testing in the described manner. Therefore, in that case all stimulus sub-patterns must be refreshed each time. To this end, one version of the method in accordance with the invention is characterized in that prior to each processing step, except that in a first test sub-cycle, a refresh step is executed for all scan chains.

One version of the method is characterized in that the writing of a stimulus pattern during an input step is realized by serially writing respective stimulus sub-patterns simultaneously into the relevant scan chains. The input is thus accelerated.

In the case of scan chains of unequal length, during the writing of stimulus sub-patterns of unequal length the stimulus sub-patterns which are shorter than a longest stimulus sub-pattern are preferably preceded by a number of dummy signals having a length equal to a difference in length between the longest stimulus sub-pattern and the relevant shorter stimulus sub-pattern, because the input of the stimulus sub-patterns is then simultaneously completed for all scan chains.

When the last response sub-pattern has been read during a last test sub-cycle, the stimulus sub-pattern corresponding to the relevant test cycle need not be written into the relevant scan chain again; instead a stimulus pattern of a next test cycle can be written into all scan chains. Therefore, one version of the method is characterized in that a last output step of a test cycle is performed simultaneously with the input step of a next test cycle for a next stimulus pattern.

Moreover, time can then be saved by testing the longest scan chain last. Therefore, one version of the method is characterized in that for each test cycle a sequence of the test sub-cycles is chosen so that, if scan chains of different length are tested, the longest scan chain is tested during a last test sub-cycle.

One embodiment of a circuit suitable for use of the method in accordance with the invention is characterized in that it comprises means for linking bistable elements which are controlled by one and the same clock signal so as to form each time a respective scan chain, per scan chain an input of its first bistable element being connectable to a test data input, an output of its last bistable element being connectable to a test data output. The input and output for is thus facilitated each scan chain formed.

One embodiment of a circuit suitable for use of the method in accordance with the invention is characterized in that direct outputs and outputs of scan chains are combined via multiplexers. This offers the advantage that the number of pins of the circuit is limited.

A further embodiment of a circuit suitable for use of the method in accordance with the invention is characterized in that the circuit comprises a check element for inputting a stimulus pattern during a test cycle and for successively activating the relevant clock signal alternately for all clock signals, with the exclusion of any other asynchronous clock signal, for reading a relevant response sub-pattern and for refreshing a relevant stimulus sub-pattern. Testing is thus facilitated.

BRIEF DESCRIPTION OF THE DRAWING

The invention will be described in detail hereinafter with reference to the following FIGS.

DETAILED DESCRIPTION OF THE PREFERRED EMBODIMENTS

Figure 1:
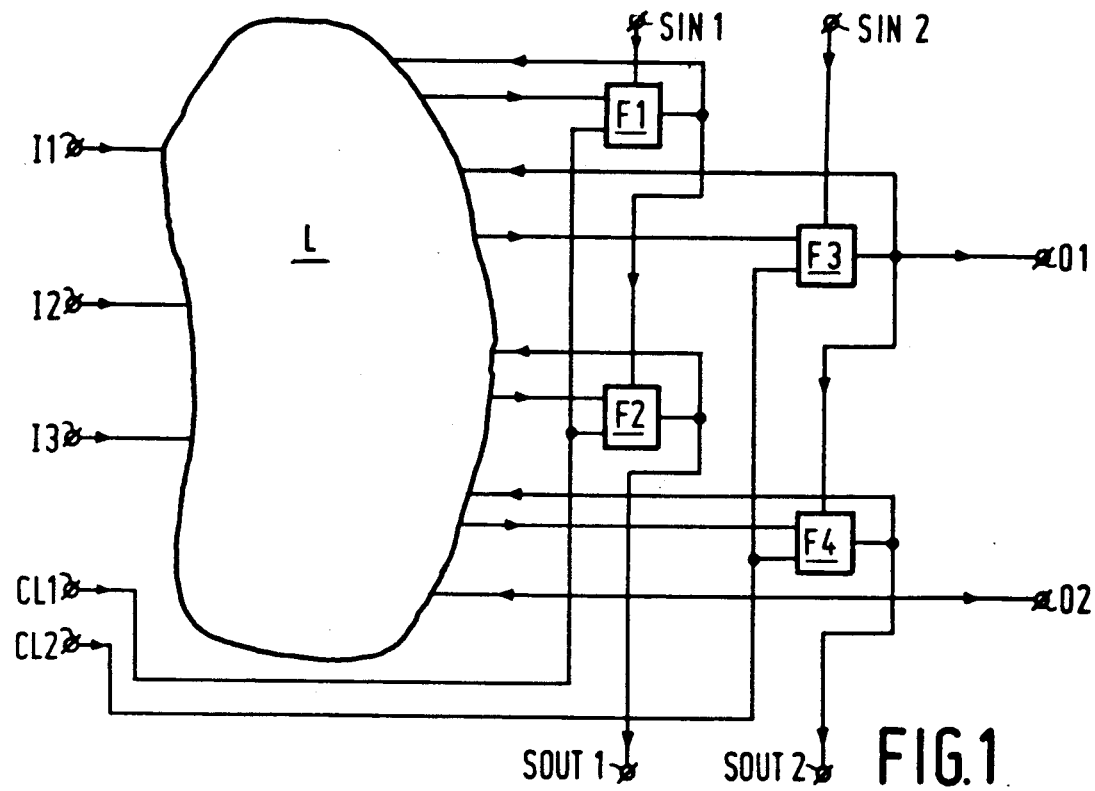
FIG. 1 shows a circuit comprising two scan chains.

FIG. 1 shows a sequential digital circuit. The reference L denotes a set of combinatory logic elements and F=(F1, F2, F3, F4) is a set of flip-flops. There are three direct inputs I1, I2, I3 and two direct outputs O1, O2. The line segments denoted by arrows represent connections whereby the various elements are linked. Two asynchronous clock signals CL1 and CL2 control the flip-flops: CL1 controls F1 and F2 and CL2 controls F3 and F4. Thus, two scan chains are formed: (F1, F2) and (F3, F4). The inputs of the flip-flops constitute outputs of L and the outputs of the flip-flops constitute inputs of L. The output of F3 is also connected to O1. Furthermore, the flip-flops comprise an input for receiving test data. F1 is the first flip-flop of the scan chain 1 and is capable of receiving test data via an external input SIN1. The output of F1 is connected to the test data input of the next flip-flop in the scan chain: F2. The output of F2 is connected to an external output SOUT1 via which test data can be read. F1 and F2 thus form a shift register whereinto stimulus sub-patterns can be serially shifted and wherefrom response sub-patterns can be serially shifted out. The operation of the other scan chain is analogous.

When static logic is used, the following takes place during a test cycle:

the input signals associated with the relevant cycle are applied to the input pins;
the associated stimulus sub-patterns are serially written into each scan chain during an input step, each time under the control of a respective clock signal;
during the first test sub-cycle, only the clock signals CL1 is activated for one clock signal period during a first processing step, the circuit being in the execution state; under the influence of this clock pulse the response sub-pattern is transferred to the scan chain, after which it is serially read from the scan chain (F1, F2) and checked during a first execution step; the other scan chain is not influenced thereby; simultaneously with the read operation the original stimulus sub-pattern can be written again;
the execution of the second test sub-cycle is analogous, be it that use is made of a pulse of the clock signal CL2;

subsequently, a next test cycle may commence, if any.

For a circuit comprising more than two asynchronous clock signals, for each clock signal a scan chain is formed in a fully analogous manner and for each scan chain a separate test sub-cycle is executed during each test cycle. If necessary, long scan chains can be subdivided into various scan sub-chains so that time is saved by inputting or outputting the patterns simultaneously in the scan sub-chains.

In the case of dynamic logic, the data in the circuit do not remain unmodified for very long; they disappear in the absence of refreshment at regular intervals. Therefore, all scan chains must be simultaneously filled with their stimulus sub-patterns. After each test sub-cycle all stimulus sub-patterns must be refreshed.

By simultaneously writing respective stimulus sub-patterns into the relevant scan chains during an input step, each sub-pattern being written under the control of its respective clock signal, time can be saved. Differences in length of said stimulus sub-patterns can be compensated for by making a suitable number of dummy signals precede the shorter stimulus sub-patterns.

Time can also be saved by combining a last output step of a test cycle with an input step of next test cycle. When a longest scan chain is tested during a last test sub-cycle, the (time-consuming) refresh step for this scan chain need no longer to be performed.

The outputs of the circuit which are not directly connected to flip-flops can be tested prior to the active portion of a clock signal, because the relevant scan chain would otherwise contain incorrect stimulus bits of the remainder of the circuit.

The stimulus patterns can be generated by an automatic test pattern generator. This generator then also predicts which response pattern will be produced by a given stimulus pattern and also checks the degree of registration in relation to the stuck-at error model.

Figure 2:
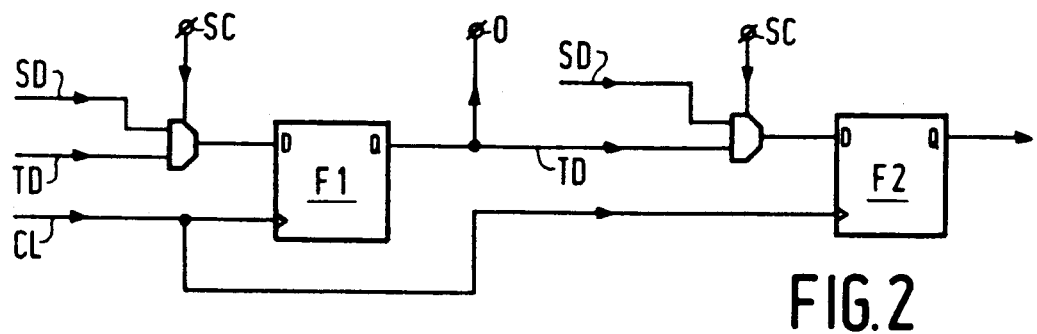
FIG. 2 shows the composition of a scan chain.

FIG. 2 shows the composition of a scan chain. Two flip-flops F1 and F2, forming part of the scan chain, are controlled by the clock signal CL. The D inputs of the flip-flops are multiplexed, so that in addition to normal system data SD test data TD can also be externally applied. The multiplexer is controlled by a scan signal SC which is supplied via an external pin. The Q-output of F1 is connected to the test data input of the multiplexer at F2 and is also connected to the direct output O. The flip-flops of a scan chain thus form a shift register where into stimulus data can be serially shifted via an external pin which is connected to the test data input of the multiplexer near the first flip-flop of the chain. Via an external pin which is connected to the Q-output of the last flip-flop of the chain, the response data produced under the influence of the combinatory logic and transferred to the scan chain under the influence of an active portion of the relevant clock signal, can be serially read.

Figure 3:
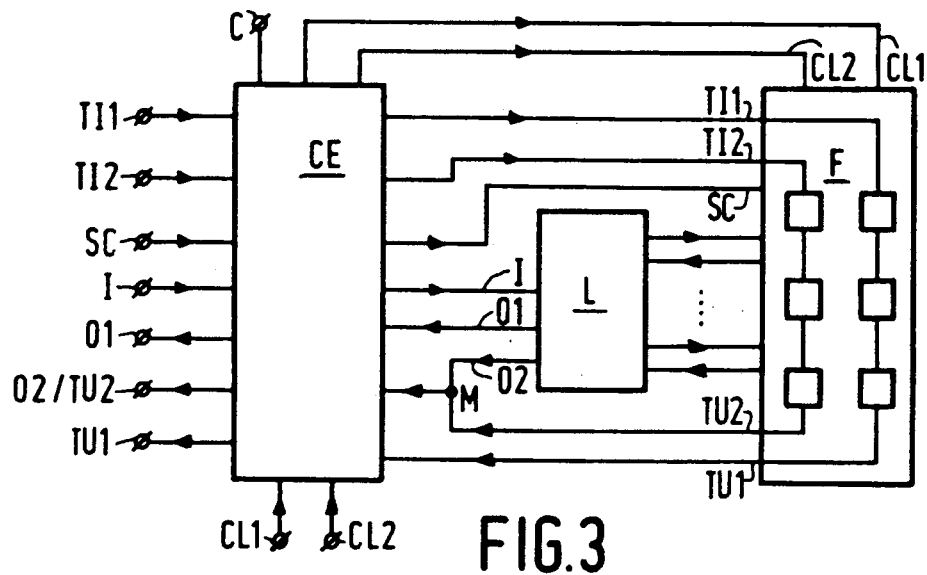
FIG. 3 shows a circuit which is suitable for use of the invention.

FIG. 3 shows a circuit comprising a set F of flip-flops, a set L of combinatory logic elements, and a check element CE. The check element CE comprises input connections to a first and a second test data input, TI1, TI2, respectively, a scan signal input SC, a direct input I for the combinatory logic, a direct output O1 for the combinatory logic, a multiplexed output O2/TU2 as a direct output and a second test data output (so that space is saved), a first test data output TU1, a first and a second clock signal CL1, and CL2, and is controlled by an external check signal C. For each test cycle CE coordinates the correct input of the stimulus sub-patterns and the alternating activation of the clock signals plus the reading of the response sub-pattern and possibly refreshment of the relevant stimulus sub-pattern. The check element CE and the other parts are not necessarily integrated in one circuit.

The use of flip-flops comprising an additional clock input for a test clock signal (for all flip-flops) precludes the necessity of forming separate scan chains, but has major drawbacks. This is because, after a processing step the entire response pattern is output during the next output step, and the entire stimulus pattern must be input again during the refresh step. Moreover, from the response pattern output the required response sub-pattern must be selected; when scan chains are used, this response sub-pattern is supplied directly by the relevant scan chain.

What is claimed is:

1. In a digital signal processing circuit jointly controlled by first and second mutually asynchronous clock signals, the improvement for enabling scan testing of said circuit, comprising: first and second scan chains of cascaded bistable elements connected to data inputs and outputs of said circuit which first and second scan chains are respectively independently controlled by said first and second clock signals; first and second test data inputs respectively connected to said first and second scan chains; and first and second result data outputs respectively connected to said first and second scan chains.

2. A method of testing a circuit having combinatory logic elements and first and second scan chains of cascaded bistable elements connected to said combinatory logic elements, and which combinatory logic elements and first and second scan chains are respectively controlled by first and second clock signals having logic levels which are changeable independent of each other, in a test cycle comprising:

writing first and second stimulus sub-patterns respectively into the bistable elements of the first and second scan chains;

first changing the logic level of said first clock signal, while maintaining said second clock signal at a constant logic level, for form, under the influence of said combinatory logic elements, a first response sub-pattern in said first scan chain;

first reading serially the first respone sub-pattern from the first scan chain;

rewriting the first stimulus sub-pattern into the bistable elements of the first scan chain;

second changing the logic level of said second clock signal, while maintaining said first clock signal at a constant logic level, to form, under the influence of said combinatory logic elements, a second response sub-pattern in said second scan chain; and second reading serially the second response sub-pattern from the second scan chain.

3. A method of testing a circuit which comprises a set of bistable elements and a set of combinatory logic elements connected thereto, according to which method a first and a second scan chain are formed, each chain consisting of a respective cascade connection of bistable elements which are controlled by a first and a second clock signal, respectively, which clock signals are mutually asynchronous, a test cycle comprising: (1) an input step during which a stimulus pattern is written into the bistable elements, a first stimulus sub-pattern being written into the first scan chain whilst a second stimulus sub-pattern is written into the second scan chain; a first test sub-cycle comprising: (2a) a processing step for the first scan chain during which a first response sub-pattern of a response pattern formed from the stimulus pattern under the influence of the combinatory logic elements is transferred to the first scan chain under the control of the first clock signal and in the absence of any other asynchronous clock signal; (2b) an output step for the first scan chain during which the first response sub-pattern is serially read; (2c) a refresh step for the first scan chain during which the first stimulus sub-pattern is refreshed; and a second test sub-cycle comprising: (3a) a processing step for the second scan chain: as the step (2a), be it that "first" is replaced by "second"; (3b) an output step for the second scan chain; as the step (2b), be it that "first" is to be replaced by "second".

4. A method as claimed in claim 3, characterized in that the set of bistable elements is subdivided into as many scan chains as there are mutually asynchronous clock signals, a test cycle comprising: an input step (1) for all scan chains and for each scan chains, with the exception of a last scan chain, a respective test sub-cycle which successively comprises a processing step which is analogous to (2a), an output step which is analogous to (2b), and a refresh step which is analogous to (2c), a last test sub-cycle for a last scan chain successively comprising a processing step which is analogous to (3a) and an output step which is analogous to (3b).

5. A method as claimed in claim 3, characterized in that a scan chain is subdivided into a plurality of scan sub-chains, the scan sub-chains being simultaneously subjected to the same test sub-cycle during a test cycle.

6. A method as claim in claim 3, for testing a circuit comprising dynamic logic, characterized in that prior to each processing step, except of that in a first test sub-cycle, a refresh step is executed for all scan chains.

7. A method as claimed in claim 3, characterized in that during an input step the writing of a stimulus pattern is realized by serially writing respective stimulus sub-patterns simultaneoulsy into the relevant scan chains.

8. A method as claimed in claim 7, characterized in that during the writing of stimulus sub-patterns of mutually different length the stimulus sub-patterns which are shorter than a longest stimulus sub-pattern are preceded by a number of dummy signals having a length equal to a difference in length between the longest stimulus sub-pattern and the relevant shorter stimulus sub-pattern.

9. A method as claimed in claim 3, characterized in that a last output step of a test cycle is performed simultaneously with the input step of a next test cycle for a next stimulus pattern.

10. A method as claimed in claim 3, characterized in that for each test cycle a sequence of the test sub-cycles is chosen so that is scan chains of different length are tested, the longest scan chain is tested during a last test sub-cycle.

11. A circuit as claimed in claim 1, characterized in that direct outputs and outputs of scan chains are combined via multiplexers.

12. A circuit as claimed in claim 1, characterized in that the circuit comprises a check element for inputting a stimulus pattern during a test cycle and for successively activating the relevant clock signal alternately for all clock signals, with the exclusion of any other asynchronous clock signal, for reading a relevant response sub-pattern and for refreshing a relevant stimulus sub-pattern.

* * * * *